United States Patent [19]

Crespo et al.

[11] Patent Number: 5,031,194
[45] Date of Patent: Jul. 9, 1991

[54] WIDEBAND DIGITAL EQUALIZERS FOR SUBSCRIBER LOOPS

[75] Inventors: Pedro M. Crespo, Bedminster; Michael L. Honig, Montclair, both of N.J.

[73] Assignee: Bell Communications Research, Inc., Livingston, N.J.

[21] Appl. No.: 392,773

[22] Filed: Aug. 11, 1989

[51] Int. Cl.$^5$ ............................................. H03H 7/30
[52] U.S. Cl. ..................................... 375/14; 375/101; 375/12; 333/28 R
[58] Field of Search ...................... 375/12, 14, 15, 101, 375/99; 333/18, 28 R; 364/724.2, 724.16; 381/103

[56] References Cited

U.S. PATENT DOCUMENTS

| | | | |
|---|---|---|---|
| 4,170,758 | 10/1979 | Tamburelli | 375/14 |
| 4,288,872 | 9/1981 | Tamburelli | 375/14 |
| 4,504,958 | 3/1985 | Tamburelli | 375/12 |
| 4,597,088 | 6/1986 | Posti et al. | 375/12 |
| 4,789,994 | 12/1988 | Randall et al. | 375/12 |
| 4,833,691 | 5/1989 | Takatori et al. | 375/14 |
| 4,847,864 | 7/1989 | Cupo | 375/14 |
| 4,870,657 | 9/1989 | Bergmans et al. | 375/14 |

OTHER PUBLICATIONS

L. Ljung and T. Soderstron, *Theory and Practice of Recursive Identification*, MIT Press, Cambridge, Mass., 1983, pp. 12–14.
R. D. Gitlin and J. S. Thompson, "A New Structure for Adaptive Digital Echo Canellation", *Proceeding of the ICC*, Chicago, Jun. 1985, pp. 1482–1486.
Simon Haykin, *Adaptive Filter Theory*, Prentice-Hall, New York, N.Y., 1986, pp. 216–217.
G. Long, D. Shwed and D. Falconer, "Study of a Pole–Zero Adaptive Echo Canceller", *IEEE Transactions on Circuits and Systems*, vol. 34, No. 7, Jul. 1987, pp. 765–769.

*Primary Examiner*—Douglas W. Olms
*Assistant Examiner*—Ralph Smith
*Attorney, Agent, or Firm*—James W. Falk; Leonard Charles Suchyta

[57] ABSTRACT

A digital decision feedback equalizer is disclosed in which compensation for the post-cursors of the impulse response of the transmission channel is divided up into two regions. A first region encompasses the initial rapidly changing unpredictable transient response, possibly oscillatory, of the transmission channel. A fast acting, close-tracking linear filter is used to compensate for this largely unpredictable initial transient. The second region of the impulse response is the slowly changing, easily predictable asymptotic tail of the impulse response. This second region can be compensated for by a relatively slow acting, simple pole-zero filter. Together, the two equalizer sections provide an overall equalizer design far less complicated and less expensive than an equalizer based on a single linear compensating filter. A finite impulse response (FIR) filter is used to compensate for the unpredictable, rapidly changing initial transient portion of the impulse response, while an infinite impulse response (IIR) filter is used to compensate for the slower acting tail portion of the impulse response.

16 Claims, 4 Drawing Sheets

DUAL FEEDBACK EQUALIZER

DATA TRANSMISSION SYSTEM

DECISION-FEEDBACK EQUALIZER (DFE)
(PRIOR ART)

DUAL FEEDBACK EQUALIZER

EQUATION ERROR METHOD

EQUATION ERROR DUAL FEEDBACK EQUALIZER

TYPICAL IMPULSE RESPONSE

OSCILLATORY IMPULSE RESPONSE

WIDEBAND DIGITAL EQUALIZERS FOR SUBSCRIBER LOOPS

TECHNICAL FIELD

This invention relates to digital signal transmission and, more particularly, to the recovery of digital pulse signals after transmission over a noisy, narrow band channel such as a telephone subscriber loop.

BACKGROUND OF THE INVENTION

As digital data services proliferate, the need for data channels to carry these services into homes and businesses likewise increases. It has become common to install special wideband transmission facilities in those places where such wideband digital services are desired. These special transmission facilities are expensive, require continuous maintenance, often in the outside plant portion of the facility, and require expensive terminal equipment. It would be of considerable economic benefit if the twisted-pair telephone wires currently extending to virtually all of the homes and businesses in the country were able to carry such wideband digital services.

It has long been known that noisy transmission channels of restricted bandwidth can be used to carry wideband digital signals with reasonable fidelity by the use of channel equalizers, i.e., circuits which compensate for the signal deterioration which takes place during transmission. This signal distortion can be represented by the impulse response of the transmission channel. The sampled impulse response includes a positive maxima which is the preferred signal sample and is called the cursor sample. The impulse response can thus be divided into a first region preceding the cursor sample, into which all pre-cursor samples fall, and a second region following the cursor sample, into which all post-cursor samples fall. Pre-cursor samples can be compensated for by means of an in-line filter in the received signal path. Post-cursor samples, however, are not so readily compensated for, particularly if such post-cursor samples are prolonged over a very large number of pulse periods.

Digital equalizers for compensating for post-cursor samples have often taken the form of adaptive digital decision feedback equalizers (DFEs) using a finite impulse response (FIR) filter in the feedback path. Such DFEs sample the received signal at regular pulse intervals, delay each sample, operate on each delayed sample to produce a compensation sample, and subtract the compensation sample from the incoming post-cursor pulse sample to substantially remove such post-cursor samples. For wideband digital signals, the impulse response of the channel extends over very many pulse intervals, requiring post-cursor compensation for that number of pulse intervals. This is typically accomplished by providing a plurality of compensating samples, using a tapped delay line. For very wideband signals, the number of taps on the delay line becomes so great that construction of the equalizer may not be economically feasible. For a 800 Kbs digital signal transmitted over a conventional twisted telephone pair, for example, the impulse response could very well extend over more than a hundred pulse intervals. In order to compensate for the distortions in such a channel, the FIR filter in the feedback path would have an exorbitantly high number of delay line taps and hence might not be economically feasible for many applications.

SUMMARY OF THE INVENTION

In accordance with the illustrative embodiment of the present invention, the post-cursor impulse response of a channel of restricted bandwidth is separated into two portions. The first portion is an initial rapidly changing, possibly oscillatory, transient response to the leading edge of the transmitted pulse. The second portion of the post-cursor impulse response is a relatively slowly changing, possible monotonic tail segment, asymptotically approaching zero. While the initial rapidly changing portion of the post-cursor impulse response requires the range and flexibility of an FIR filter, the trailing portion of the post-cursor impulse response is relatively easy to simulate because of its slowly changing, highly predictable value. This trailing portion can therefore be modeled with a much less complicated, less expensive filter design such as an infinite impulse response (IIR), or pole-zero filter. In accordance with the present invention, the two portions of the post-cursor impulse response are compensated for separately in two different filters. One filter is capable of compensating for the initial largely unpredictable, rapid changes in the impulse response. The other filter is of a far less complex design, yet which is nontheless fully capable of compensating for the slower changes in the asymptotic tail of the impulse response. Since the initial transient portion of the post-cursor impulse response extends over relatively few pulse periods, the number of taps on the linear adaptive FIR type filter needed to compensate for this initial transient is likewise relatively small. Furthermore, since an FIR type filter is not necessary to compensate for the extended tail portion of the impulse response, a relatively simple pole-zero IIR type filter can be used, also having very few taps. The resulting dual feedback, dual compensation type of equalizer is considerably simpler and less expensive to construct than an equalizer using a single FIR type feedback filter to compensate for the entire impulse response.

In accordance with one feature of the present invention, the post-cursor region of the impulse response can be arbitrarily divided at any point in time. It is therefore possible to minimize the overall equalizer design by minimizing the sum of the taps needed for the FIR and the taps needed for the IIR filter.

BRIEF DESCRIPTION OF THE DRAWINGS

A complete understanding of the present invention may be gained by considering the following detailed description in conjunction with the accompanying drawings, in which.

To facilitate reader understanding, identical reference numerals are used to designate elements common to the figures.

DETAILED DESCRIPTION

Figure 1:
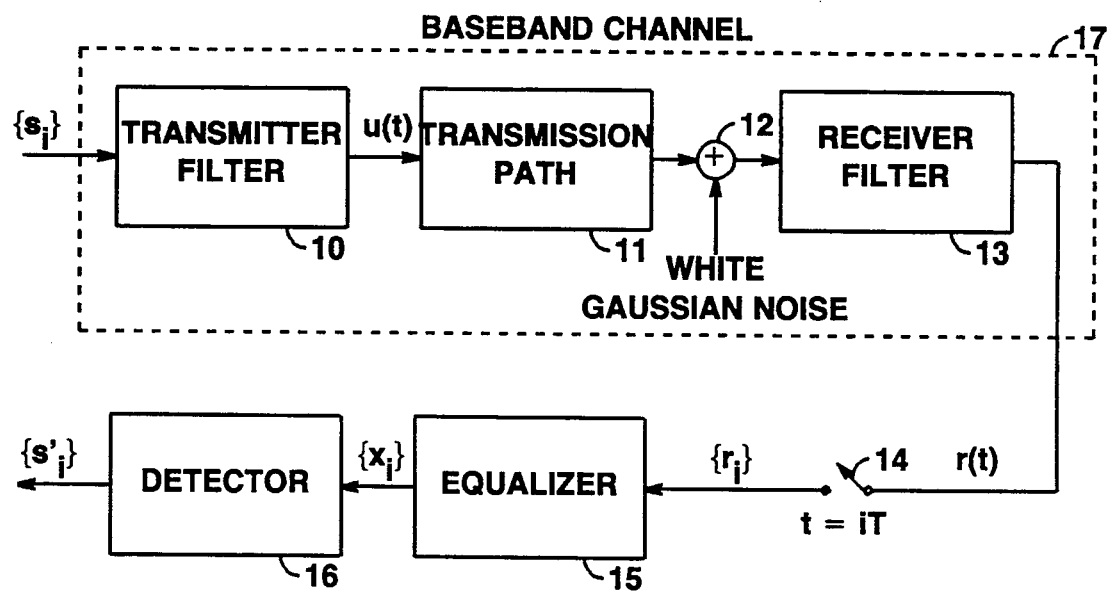
FIG. 1 shows a circuit model of a data transmission system using digital equalization to recover the data signal.

Before proceeding to a detailed description of the illustrative embodiment of the present invention, it is convenient to first provide some background in the art of digital equalization. FIG. 1, for example, is a model of a conventional pulse-amplitude modulation (PAM) data transmission system. The data transmission system of FIG. 1 comprises a baseband transmission channel 17 including a transmitter filter 10, a transmission path 11 and a receiver filter 13. White Gaussian noise is added to the signal at adder circuit 12. At the receiving end of the transmission channel, the signal is sampled by sampler 14 at the signal baud rate. An equalizer 15 removes the distortions caused by intersymbol interference in channel 17 and detector 16 recovers an approximation of the input signal to channel 17. For digital signals, detector 16 need be no more than a threshold device for regenerating digital pulse signals.

It is assumed that a symbol $s_i$ is transmitted at each time iT, where 1/T is the symbol (baud) rate. The input to the transmission path 11, therefore, is the PAM data signal $$u(t) = \sum_{j=-\infty}^{\infty} s_j g(t - jT) \quad (1)$$

where g(t) is the impulse response of the transmitter filter 10. The output of the receiver filter 13 is given by $$r(t) = \sum_{j=-\infty}^{\infty} s_j h(t - jT) + n(t) \quad (2)$$

where h(t) is the combined impulse response of the channel 17, i.e., of the transmitter filter 10, the transmission path 11, and receiver filter 13. The noise n(t) is typically modeled as having Gaussian statistics, and hence white Gausian noise is shown being added to the signal at adder 12.

Assuming that the receiver recovers the timing information from the received signal and samples the signal r(t) synchronously at times iT, i=1, 2, . . . , with sampling switch 14, then the corresponding sample at time iT is denoted as $r_i$ and is given by $$r_i = \sum_{j=-\infty}^{\infty} s_j h_{i-j} + n_i \quad (3)$$

where $h_i$ and $n_i$ are samples of the corresponding continuous-time waveforms at time iT. As shown in FIG. 1, this signal is applied to equalizer 15 which recovers the compensated signal $\{x_i\}$, which, in turn, is applied to detector 16. Detector 16 provides the thresholds to regenerate the digital output signal $\{s'_i\}$, which is an estimate of the transmitted signal $s_i$.

Figure 2:
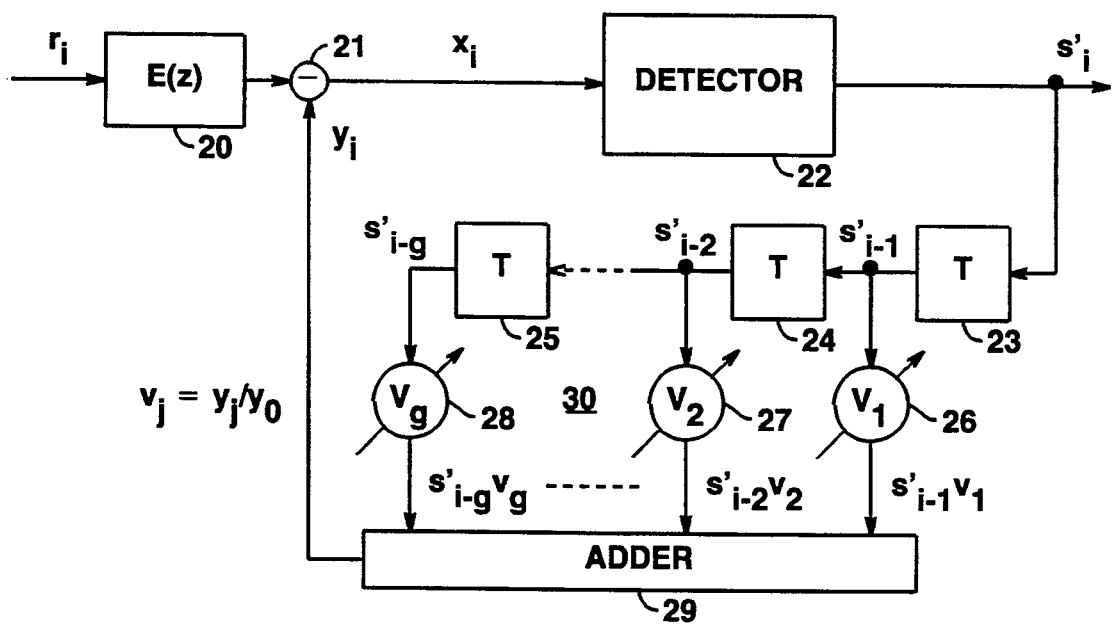
FIG. 2 shows a detailed circuit diagram of a receiver for the digital transmission system of FIG. 1 using a well-known decision feedback equalizer (DFE) having a finite impulse response (FIR) filter in the feedback path.

A block diagram of a conventional prior art receiver with a decision-feedback equalizer (DFE) is shown in FIG. 2. The DFE circuit of FIG. 2 replaces the equalizer 15 and detector 16 of FIG. 1. The receiver of FIG. 2 comprises a linear transversal filter 20 designed to remove the so-called "pre-cursor" samples of the impulse response from the received signal. Detector 22, like detector 16 of FIG. 1, is a threshold device for generating output pulses. The feedback path around detector 22 comprises a finite impulse response (FIR) filter 30 of well-known architecture. A plurality of delay line segments 23, 24, . . . , 25 form a tapped delay line. Each of segments 23–25 has a delay equal to the intersymbol period of the transmitted pulse train. At each of the taps in the delay line 23–25 is a respective one of multipliers 26, 27, . . . , 28. Each of multipliers 26–28 is individually controllable to provide a different controllable multiplication factor or coefficient for the signals appearing at the connected tap of delay line 23–25. An adder circuit 29 combines the outputs of multipliers 26–28 and supplies the sum to subtracter circuit 21. The multiplier coefficients of the multipliers 26–28 are, of course, selected to provide signals at subtracter 21 which exactly cancel the intersymbol interference (ISI) components of the input signal caused by the impulse response of the transmission channel 17. Typically, the coefficient values for multipliers 26–28 are controlled by an error signal developed across detector 22. The coefficient values are adjusted so as to drive the error signal to zero, all in accordance with well-known equalizer adaptation techniques.

In general, the purpose of the feedback filter 30 is to simulate the distortions (intersymbol interference) caused by the transmission channel, and to subtract these distortions from the incoming signal, thereby to restore the originally transmitted signal. The tapped delay line 26–28 provides an output for each pulse period occurring during the impulse response period $\tau$. The multiplier coefficients for multipliers 26–28 are adjusted to provide compensating signals at each pulse period which exactly compensate for the distortion at that pulse period caused by the impulse response. As is well-known, such transversal filter architectures are capable of simulating any impulse response function, provided that sufficient taps are present to span the entire impulse response, and provided that the multiplier coefficient values are adapted appropriately by an error function. Typically such coefficient values are adapted during a training session while the equalizer is driven by a known digital pulse stream. Moreover, the received signal is usually converted to digitally encoded values so that all arithmetic processes (addition, subtraction, multiplication) can be carried out in digital circuitry. All of the circuit elements of FIG. 2 are well-known in the equalizer art and will not be described in further detail here.

If the sampled input to the receiver of FIG. 2 at time iT is $r_i$, as noted in connection with FIG. 1, then the output of the DFE is the estimated transmitted symbol $\{s'_i\}$. The DFE consists of a standard in-line linear transversal filter 20, or tapped delay line, having a transfer function E(z), followed by a feedback loop. The feedback path consists of a finite length (FIR) transversal filter 30, having a transfer function B(z), and the feedforward path is the threshold detector 22. The estimated transmitted symbols, $\{s'_i\}$, are the inputs to the transversal filter 30, and the output, $y_i$, of transversal filter 30 is subtracted from the output of the transversal filter 20. As discussed above, the FIR transversal filter 30 comprises delay line sections 23, 24, ..., 25 forming the tapped delay line. At each tap, a multiplier (26, 27, ..., 28) provides a controlled gain $v_j$ for the delayed signal at that tap. The resulting compensating signals are summed in adder circuit 29 and the resulting sum $y_i$ is subtracted from the input signals in subtracter 21. If an adequate number of taps are provided, and if the gains of amplifiers 26–28 are correctly adjusted, a close approximation of the system input signal can be recovered from the distorted received signal. The present invention involves the improved design of decision feedback equalizers of the type shown in FIG. 2 in order to permit the recovery of digital signals in the presence of high levels of intersymbol interference extending over very many pulse periods.

In order to better understand the present invention, it is advantageous to decompose $r_i$ into the following components:

$$r_i = s_i h_0 + \sum_{j=-1}^{-M} s_{i-j} h_j + \sum_{j=1}^{N} s_{i-j} h_j + n_i \tag{4}$$

where $s_i h_0$ is the desired component, the middle two terms on the right are the intersymbol interference (ISI), and the last term on the right is the noise signal. The second term on the right is called the "pre-cursor ISI", since it represents interference components preceding the desired signal sampling time. The third term on the right is called the "post-cursor ISI", since it represents interference components following the desired signal sample time. The "cursor" (j=0) is, of course, the optimum sampling time slot for detecting the desired digital signal $s_i$. Note that pre-cursor ISI is caused by the impulse response samples $h_j$ for $j<0$, and post-cursor ISI is caused by $h_j$ for $j>0$. The pre-cursor ISI is caused by the initial finite rise time of the impulse response. This portion of the intersymbol interference therefore precedes the optimum sampling time (pre-cursor) and another portion follows the optimum sampling time (post-cursor). It is assumed for the purposes of analysis that M and N are finite, i.e., that the impulse response $\{h_i\}$ has some finite duration in order to permit recovery of the transmitted signal. This is a reasonable assumption if the number of taps M and N are sufficiently large to encompass all of the impulse response of any significant magnitude. The purpose of the equalizer of FIG. 2, of course, is to remove all of the ISI, and thereby extract the transmitted symbol from $r_i$.

Assume initially that M=0, that is, that there is no pre-cursor ISI, and that transfer function of filter 20 is simply the constant gain $1/h_0$. The output of filter 20 from equation (4) is then given by $$\frac{r_i}{h_0} = s_i + \sum_{j=1}^{N} s_{i-j} v_j + \frac{n_i}{h_0} \tag{5}$$

where $v_j = h_j/h_0$. The sampled impulse response of the baseband channel 17, sampler 14 and multiplier 20 ($1/h_0$) is therefore $\{v_j\}$, $j=0, 1, \ldots, N$, where $v_0=1$.

Suppose that the receiver of FIG. 2 is attempting to detect the symbol $s_i$. Assume that the symbols $s_{i-j}$ for $j=1, \ldots, N$, have been correctly detected, so that $\{s'_{i-j}\}=s_{i-j}$ for $1 \leq j \leq N$, and that the coefficients of multipliers 26–28 of filter 30 are $v_1, \ldots, v_N$. The output of the transversal filter 30 at time t=iT is then given by $$y_i = \sum_{j=1}^{N} s_{i-j} v_j, \tag{6}$$

and the input to detector 22 is therefore $$x_i = s_i + \frac{n_i}{h_0}. \tag{7}$$

The feedback filter 30, with proper coefficients, can therefore remove the post-cursor ISI. In practice, the impulse response coefficients $v_1, \ldots, v_N$ are initially unknown, so that the coefficients of the multipliers 26–28 at the taps of the feedback filter 30 are typically dynamically altered (adapted) via some error driven adaptation mechanism such as the least mean square (LMS) algorithm shown in the text *Adaptive Filter Theory*, S. Haykin, Prentice-Hall, New York City, 1986, pages 216–217.

Because the data symbols $s_{i-j}$ associated with pre-cursor ISI have not yet been detected at time iT, the feedback filter 30 cannot be used to eliminate pre-cursor ISI. However, pre-cursor ISI can be eliminated by the filter 20 (at the expense of amplifying the input noise $n_i$). In this case, the transfer function E(z) of filter 20 is selected so that the combined sampled impulse response of the transmitter filter 10, channel 11, receiver filter 13, and filter 20 is given by $$0 \ldots 01 v_1 v_2 \ldots v_N \tag{8}$$

where the number of initial zeroes spans the resultant group delay. That is, the pre-cursor samples are each reduced to zero. The "1" in the sample sequence (8) corresponds to the cursor, i.e., the desired digital signal sample (j=0). The design and construction of such pre-cursor compensating transversal filters is well-known and will not be further described here. Given such pre-cursor compensation, the feedback filter 30 can then be used to eliminate the residual post-cursor ISI due to $v_1, \ldots, v_N$, all in accordance with well-known prior art techniques. For a typical telephone subscriber loop channel and a reasonably high transmission rate, e.g., 800 kbps, the pre-cursor ISI can be adequately reduced by using a transversal filter 20 with less than five delay line taps.

The primary advantage of using the decision-feedback equalizer architecture of FIG. 2, as compared to a more conventional in-line linear equalizer, is reduced noise enhancement. In particular, post-cursor ISI can be entirely canceled (theoretically) by a decision-feedback equalizer without affecting the noise variance at the input to detector 22. One possible disadvantage of the DFE of FIG. 2 is so-called "error propagation". That is, if an error is made in detecting the symbol $s_i$, then this incorrect symbol $\{s'_i\}$ is fed back to the input of filter 30, and the error "propagates" into future tap coefficient adjustments, tending to cause error bursts. It is well-known, however, that with moderate to low error rates, i.e., on the order of $10^{-5}$, such error propagation causes only minor degradation in the performance of the DFE of FIG. 2. Consequently, a decision feedback filter of the type shown in FIG. 2 has been typically proposed for use with channels with severe ISI, such as twisted-wire telephone pairs.

Figure 6:
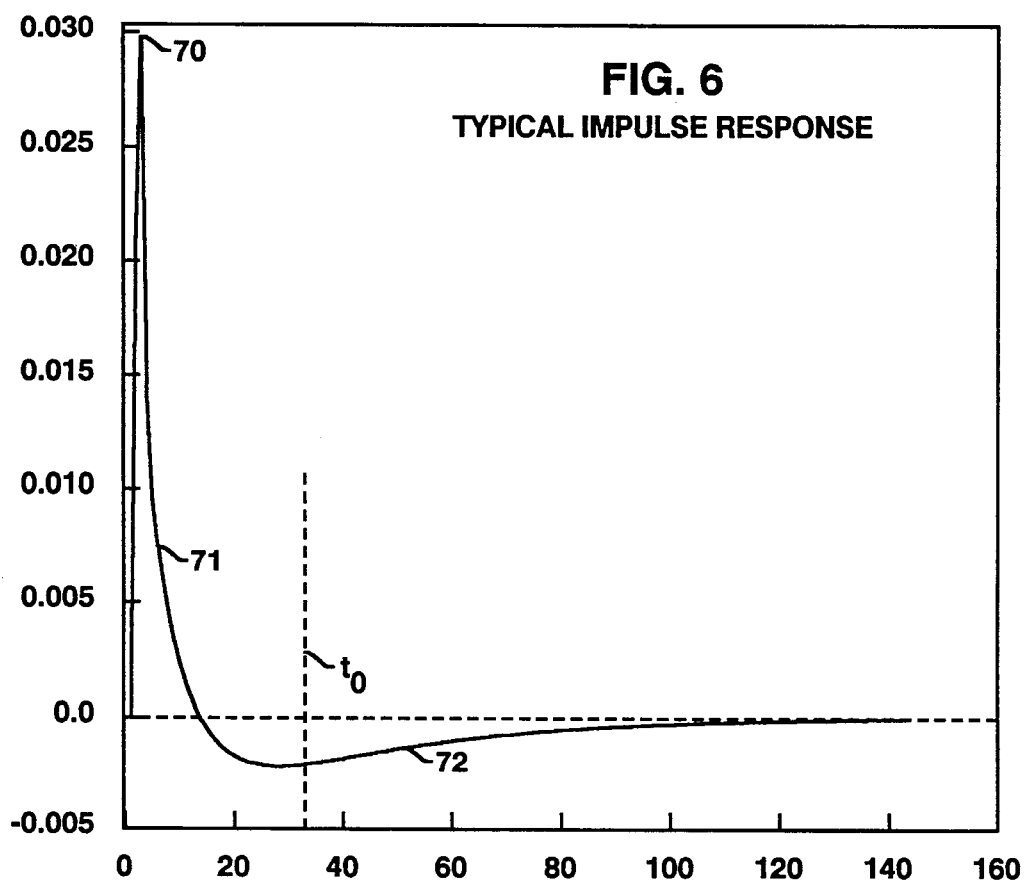
FIG. 6 shows a graph of a typical impulse response of a twisted-wire pair type of transmission system which can be modeled as show in FIG. 1.

In FIG. 6 there is shown a typical impulse response for a transmission channel such as a telephone twisted-wire pair. As can be seen in FIG. 6, the impulse response comprises an initial high amplitude transient 70, followed by an abrupt decrease 71 in the response to below zero, followed by a long, gently decreasing tail 72 asymptotically approaching zero. The number of sampling intervals, and hence the number of taps required for a linear FIR equalizer is shown on the x-coordinates of FIG. 6. Note that the number of taps in the transversal filter 30 that are necessary to cancel all of the post-cursor ISI is N, the number of associated impulse response samples (called "post-cursors") following the desired signal sampling time 70. The number of taps therefore increases linearly with the symbol rate. In particular, the post-cursors are samples of the continuous-time impulse response h(t) of FIG. 6 at times $t=iT$, $i=1, 2, \ldots, N$, where $1/T$ is the symbol rate, and it is assumed that $h(t)=0$ for $t>NT$. If the symbol rate is doubled to $2/T$, then T is replaced by $T/2$ and the post-cursors become samples of h(t) at times $t=iT/2$, $i=1, 2, \ldots, 2N$. To generalize this, assume that the impulse response $h(t)=0$, for $t>\tau$, the information rate is R bits/sec, and that pulse amplitude modulation (PAM) with L levels/symbol is used. The symbol rate in this case is $R/(\log_2 L)$, and the number of post-cursors is approximately $$\frac{R\tau}{\log_2 L}.$$

For example, if binary signals are transmitted at 800 kbps over 12K feet of 24 gauge twisted-pair wires, the duration of the impulse response is typically 150 μsec and the number of taps in the DFE of FIG. 2 required to completely cancel the post-cursor ISI is approximately 120. FIG. 6 is the graph of this impulse response. A decision feedback FIR filter with this number of taps is relatively expensive to implement. It is the purpose of the present invention to provide a decision feedback equalizer structure which does not require this large number of taps and hence can be constructed less expensively.

In accordance with the principles of the present invention, the tail of the impulse response, starting at time $t_0$, can be accurately approximated as the impulse response of a simple filter with both poles and zeroes and with fewer taps. It is therefore possible to use an infinite impulse response (IIR) transversal filter instead of the conventional finite impulse response (FIR) transversal filter, and thereby severely reduce the number of taps required to cancel the tail of the impulse response. The tail of the impulse response of FIG. 6 is that portion following $t_0$, i.e., h(t) for $t>t_0$. This tail can be accurately synthesized as the impulse response of an IIR filter with one or two poles. In accordance with the present invention, a dual decision feedback equalizer such as that illustrated in FIG. 3 can therefore be used to synthesize and cancel the entire impulse response. More particularly, and as will be shown in connection with FIG. 3, cascading an FIR filter, with tap values equal to the sampled impulse response for $t<t_0$, and a two-pole filter, which synthesizes the samples of h(t) for $t>t_0$, allows the entire post-cursor impulse response to be synthesized.

In accordance with the present invention, the impulse response of subscriber loops can be accurately modeled by the combination of an adaptive FIR filter with an adaptive two-pole IIR filter. This is due to the fact that the asymptotic behavior (as t becomes large) of such an impulse response is typically determined by the response of the channel at low frequencies, which is determined by transformer coupling of the transmitted signal to the channel. This low frequency behavior is well-understood and very similar for all twisted pair channels, and hence has an easily predictable form. The complicated high frequency behavior of some subscriber loop channels, due, in part, to such things as bridged taps, is much less predictable, but typically affects only the first part of the post-cursor impulse response. In further accord with the present invention, this initial high frequency behavior is advantageously modeled by an FIR filter which models a much larger range of short term impulse responses.

A two-pole IIR filter having transfer function $\alpha/(1-b_1z^{-1}-b_2z^{-2})$ requires only three taps. Therefore, the number of taps required to synthesize all of the post-cursors of the channel impulse response is the number of taps in the FIR filter plus three. The fraction of the impulse response spanned by the the FIR filter is $f=t_0/\tau$, where $\tau$ is the entire duration of the impulse response. The number of taps required in a DFE to cancel post-cursor ISI can therefore be reduced, relative to a conventional DFE architecture of FIG. 2, by the fraction $(fN+3)/N \approx f$ for large values of N.

Figure 3:
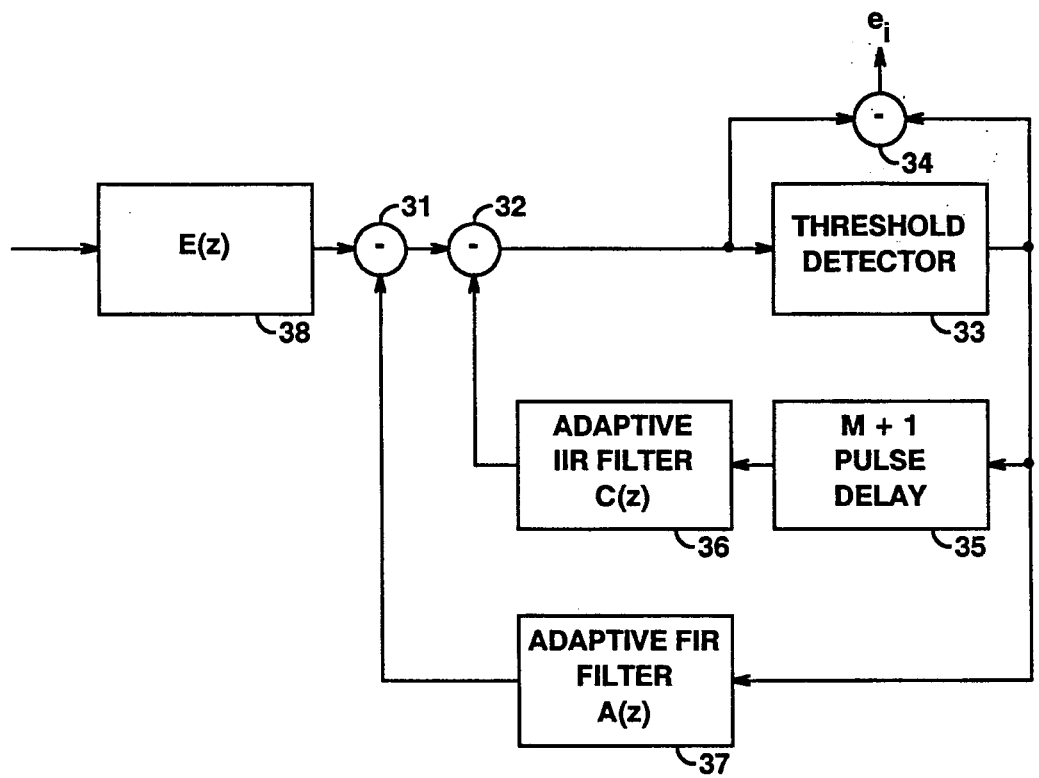
FIG. 3 shows a general block diagram of a dual feedback equalizer in accordance with the present invention for use in the receiver circuit of FIG. 2.

In FIG. 3 there is shown a general block diagram of a dual feedback decision-feedback equalizer of the configuration described above. In FIG. 3, a pre-cursor canceling linear transversal filter 38 is followed by a cascade of two subtracter circuits 31 and 32, in turn followed by threshold detector 33. A dual feedback path around detector 33 includes a first feedback path comprising the adaptive linear finite impulse response filter 37 the output of which is applied to subtracter circuit 31. A second feedback path includes the adaptive infinite impulse response filter 36, the output of which is applied to subtracter circuit 32. A delay circuit 35 delays the application of the output of detector 33 to filter 36 for a number of pulse periods equal to one more than the number of taps on FIR filter 37. Substracter circuit 34 derives an error signal by comparing the input and the output of threshold detector 33. This error signal is used to drive the coefficient values at the taps of filters 36 and 37.

In FIG. 3, A(z) is the transfer function of FIR filter 37 and $C(z)=\alpha/[1-B(z)]$ is the transfer function of two-pole filter 36. In practice, the impulse response of the channel is initially unknown, so that an adaptive algorithm is needed to adapt the coefficients of A(z) and C(z) to cancel the post-cursor ISI. This is typically accomplished by selecting the coefficients of the filters to minimize the means squared error (MSE) $E(e_i^2)$, where E denotes expectation and $e_i$ is the error signal shown in FIG. 3. It can be shown that the minimum value of $E(e_i^2)$ occurs when the impulse response of the combined feedback filters 36 and 37 (in this case A(z) and C(z)) exactly matches the channel post-cursor impulse response.

In general, the mean square error may contain many local optima. Straightforward application of a standard adaptive algorithm may therefore lead to suboptimal solutions in which the post-cursor ISI is not completely canceled. Furthermore, if the IIR filter 36 is implemented in direct form, then the adaptive algorithm must be applied in such a way that the transfer function C(z) of filter 36 is stable. This latter problem can be easily solved by simply enforcing conditions on the two tap values of B(z) in filter 36 to guarantee that its poles lie inside the unit circle. Another solution is to use an alternative, slightly more complex filter structure for filter 36, but for which stability is easily maintained. One solution to the local optima problem is called the "equation error" method of IIR adaptation.

Figure 4:
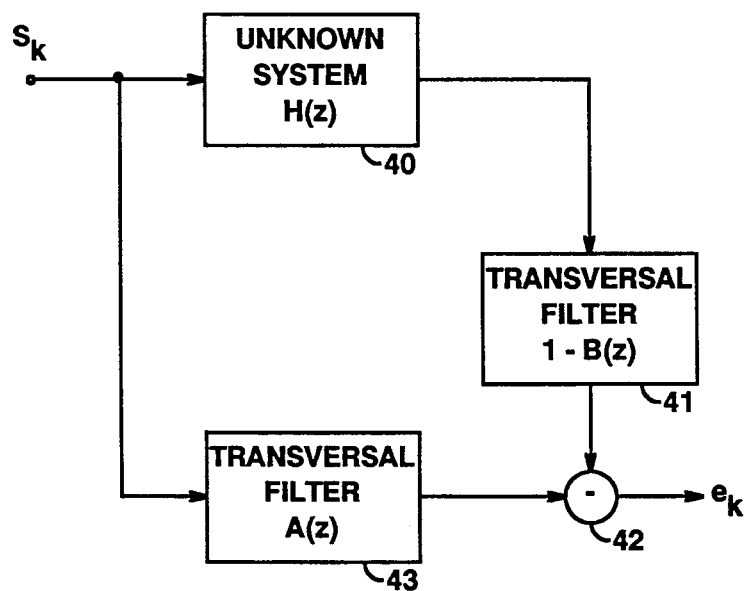
FIG. 4 shows a general block diagram of the equation error method of equalizer adaptation which is useful in the equalizer of the present invention.

FIG. 4 shows a coefficient adaptation technique based on the "equation error" method disclosed in *Theory and Practice of Recursive Identification*, L. Ljung and T. Soderstron, MIT Press, Cambridge, Mass., 1983, pages 12-14. Application of this equation error method to echo cancellation is shown in "A New Structure for Adaptive Digital Echo Cancellation," R. D. Gitlin and J. S. Thompson, *Proceeding of the ICC*, June, 1976, pp. 1482-1486, and "Study of a Pole-Zero Adaptive Echo Canceler," G. Long, D. Shwed and D. Falconer, *IEEE Transactions on Circuits and Systems*, Volume 34, Number 7, July, 1987.

In FIG. 4, the systems to be simulated is designated as unknown system 40. The error signal $e_k$ is the difference, derived in subtracter circuit 42, between the outputs of two transversal filters 41 and 43, one (43) connected to the input of the unknown system 40 and the other (41) connected to the output of the unknown system 40. Filter 43 has a transfer function A(z) and filter 41 has a transfer function $(1-B(z))$. The z-transform of the error, $e_k$, can then be written as $$E(z) = [H(z)[1-B(z)] - A(z)]S(z) \quad (9)$$

where H(z) is the z-transform of the unknown system 40, S(z) is the z-transform of the input signal $s_k$, and it is assumed that A(z) (filter 43) and B(z) (filter 41) are finite polynomials corresponding to finite-length transversal filters. Suppose that H(z) is a rational function of z, i.e., $$H(z) = \frac{\Theta(z)}{1 - \Psi(z)} \quad (10)$$

where $\Theta(z)$ and $\Psi(z)$ are finite polynominals. Then from equation (9), the error $e_k$ is zero if $$A(z) = \Theta(z) \text{ and } B(z) = \Psi(z). \quad (11)$$

Assuming that H(z) is initially unknown, in order to identify H(z) the coefficients of filters 43 and 41 must be adapted so that they converge to the coefficients of $\Theta(z)$ and $\Psi(z)$, respectively. Assume that the order (number of coefficients and hence number of taps) of filter 43 is at least as large as the order of $\Theta(z)$, and that the order of filter 41 is at least as large as the order of $\Psi(z)$. It can then be shown that, in the absence of noise, and with some minor restrictions on the input sequence $s_k$, A(z)−(B(z)) will converge to $\Theta(z)-(\Psi(z))$ if the taps of filters 41 and 43 are adapted with a gradient algorithm to minimize the "equation error" $e_i^2$. In this case $e_i^2$ is a quadratic function of the coefficients of A(z) and B(z), so that there are no local optima.

Figure 5:
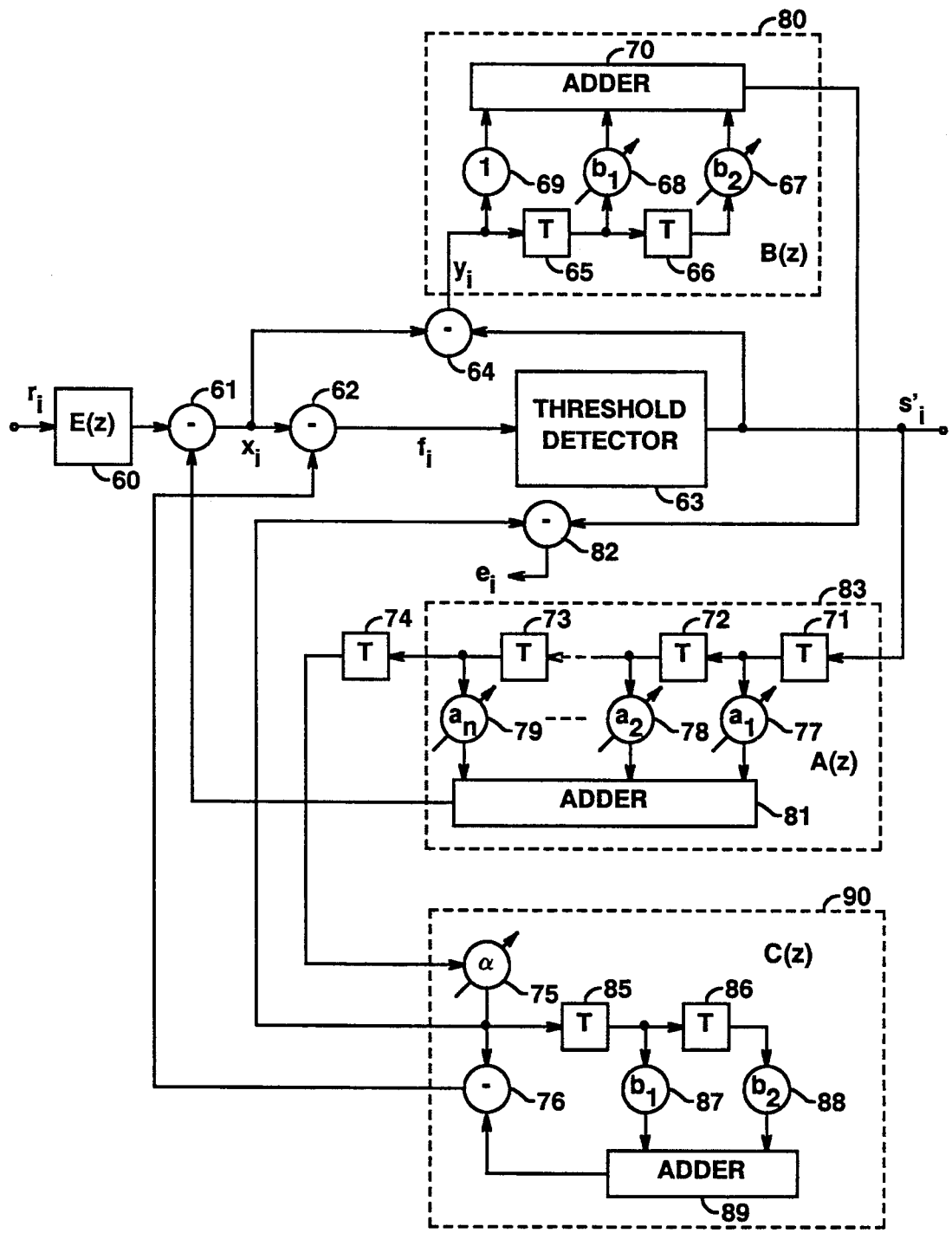
FIG. 5 shows a detailed circuit diagram of the dual feedback equalizer of FIG. 3 showing the use of both a finite impulse response (FIR) equalizer section and an infinite impulse response (IIR) equalizer section in the feedback path, and using the equation error method of equalizer adaptation.

In further accordance with the present invention, FIG. 5 shows a dual feedback decision feedback equalizer using the equation error method of coefficient adaptation. The decision feedback equalizer consists of a pre-cursor in-line adaptive transversal filter 60 followed by a cascade of two subtracters 61 and 62. The output of subtracter 62 is applied to the input of threshold detector 63 the output of which is applied to linear FIR filter section 83. The output of filter section 83, in turn, is applied to subtracter 61. Filter section 83 comprises the tapped delay line 71–73, having multipliers 77, 78, . . . , 79 at the taps thereof. Adder 81 sums the outputs of the multipliers 77–79 and applies the sum to subtracter 61.

The IIR filter section 90 is connected through delay section 74 to the output of delay line 71–74. IIR filter section 90 comprises a multiplier 75 having a multiplication factor α and a two-section delay line comprising delay sections 85 and 86. Tap multipliers 87 and 88 provide compensating signals to adder 89 the output of which is applied to subtracter circuit 76. The other input to subtracter circuit 76 is the output of multiplier 75. The transform of the output of substracter circuit 76 is $$\frac{\alpha}{(1 - B(z))}$$

which is, in turn, applied to subtracter 62.

Rather than using the error signal $y_i$ (FIG. 3) to drive the multipliers in the filter sections, the error signal $y_i$ is applied to transversal filter section 80 comprising a tapped delay line including delay line sections 65 and 66, multipliers 67, 68 and 69 and adder circuit 70. The output of adder circuit 70 is applied to one input of subtracter circuit 82, the other input of which comes from the output of multiplier 75. The output of subtracter 82 is the actual error signal that drives the tap coefficients of the transversal filters 80 and 83. Note that the coefficients of multipliers 87 and 88 in filter 90 are identical to the coefficients of multipliers 67 and 68 in filter 80 and hence these values need only be calculated once and then applied to both filter sections 80 and 90.

From the above structural description, it can be seen that the transfer function of FIR transversal filter 83 is A(z) of order n and the transfer function of recursive IIR filter 90 is $C(z) = \alpha/[1-B(z)]$. Assume that the pre-cursor filter 60 (E(z)) completely eliminates the pre-cursor ISI, and that the remaining post-cursor impulse response is $v_1, \ldots, v_N$, as noted in connection with FIG. 3. Typically, the coefficients of A(z) in filter 83 are adapted to minimize the error signal $y_i$ shown in the FIG. 5. However, in FIG. 5 the error signal $e_i$ is used instead. This is because $y_i$ contains residual post-cursor ISI, which acts as an added noise component in the adaptive algorithm. This source of noise is eliminated in the architecture of FIG. 5.

If the coefficients of A(z) in filter 83 at time i are $\alpha_1(i), \ldots, \alpha_n(i)$, where $n<N$, and if the least means square algorithm is used, $$\alpha_k(i+1) = \alpha_k(i) + \beta s_{i-k} e_i \quad (12)$$

where β is the adaptation step-size. It can readily be shown that if the error $e_i$ is driven to zero by the adaptive algorithm, then $\alpha_k = v_k$, k=1, . . . , n. Then, from FIG. 5, $$x_i = s_i + y_i. \quad (13)$$

If $\hat{n}_i$ is the noise content of the output of the pre-cursor filter 60 in response to the noise sequence $n_i$, then the remaining post-cursor ISI plus noise is $$y_i = \sum_{k=n+1}^{N} v_k s_{i-k} + \hat{n}_i. \tag{14}$$

The residual post-cursor ISI given by the first term on the right is to be canceled by the two-pole filter 90.

The taps of two-pole filter 90 can be adapted to cancel the remaining post-cursor ISI, which is due to the tail of the channel impulse response, via the equation error method. Assuming that the noise $\hat{n}_i=0$, that the tail of the channel impulse response is all-pole, and that the order of filter section 80 is large enough (i.e., greater than or equal to the order of the channel transfer function), then the error signal $e_i$ in FIG. 5 can be driven to zero by adapting the value of $\alpha$ and values of the coefficients of filter section 80. In particular, if the least means square algorithm is used, then $$\alpha(i+1) = \alpha(i) + \beta s_{i-n-1} e_i \tag{15a}$$

and $$b_k(i+1) = b_k(i) + \beta y_{i-k} e_i \tag{15b}$$

where i is the time index, $\beta$ is the step-size, and $b_k$ is the kth coefficient of filter section 80. Of course, in the presence of noise, the error $e_i$ will have some residual variance which depends on $\beta$ and the input and noise statistics.

The residual post-cursor ISI in equation (13) can therefore be canceled by subtracting from $x_i$ the output of a filter with transfer function $z^{-n-1}\alpha/[1-B(z)]$ and input sequence $\{s_j\}$, where $\alpha$ is adapted using equation (15a) and the coefficients of $B(z)$ are a copy of the coefficient of filter 80. This is exactly the configuration shown in FIG. 5, where the error signal $e_i$ is used to adapt both the coefficients of filter 83 and of filter 90 according to equations (12) and (15). When $e_i=0$, the impulse response of the combination of filters 83 and 90 exactly matches the channel post-cursor impulse response. Note that the variable portions of the filters 80 and 90 are identical and can hence both be realized by multiplexing the inputs to and the corresponding outputs from, one physical filter.

If the pre-cursor ISI is negligible, so that the filter 60 in FIG. 5 can be replaced by a constant gain, then the coefficients of filter 83 match the first n coefficients of the sampled channel impulse response. In this case, the DFE structure shown in FIG. 5 can be easily combined with the timing recovery scheme described in the copending application of P. M. Crespo, Ser. No. 07/392,772, filed of even data herewith and assigned to applicants' assignee. This timing recovery scheme relies on estimates of the channel impulse response to determine the optimal sampling phase of the received signal. For transmission of moderate data rates over twisted-pairs, such as the current ISDN standard of 160 kbps, pre-cursor ISI is typically negligible, so that this combination is possible.

In the absence of noise and finite precision effects, the structure shown in FIG. 5 can cancel perfectly all post-cursor ISI. Of course, once noise is added to the channel, then error propagation becomes a potential problem. However, assuming that the impulse response of the IIR feedback filter 90 in FIG. 5 is approximately the same as that of a conventional FIR filter that cancels the entire post-cursor impulse response, then the performance of both structures in the presence of noise should be approximately the same (ignoring finite precision effects).

The convergence of the dual feedback equalizer structure shown in FIGS. 3 and 5 may be slower than that of the analogous FIR structure. However, if the channel is time-invariant, or changes very slowly, such as a typical subscriber loop channel, this slower convergence has little effect. If speed of convergence is a problem, alternative adaptive algorithms, such as least square, or lattice algorithms taught in the aforementioned Haykin text can be used to speed up the convergence of the IIR filter 90. In particular, because the tail of a typical subscriber loop impulse response is accurately modeled with only two poles, relatively little additional complexity is required to adapt the filter 80 using a fast least square algorithm as opposed to the LMS algorithm. Moreover, using a two-stage lattice structure for filter 80 (which also requires only a minor increase in complexity relative to the direct implementation), gives a very simple test for filter stability, as taught in the Haykin text.

Figure 7:
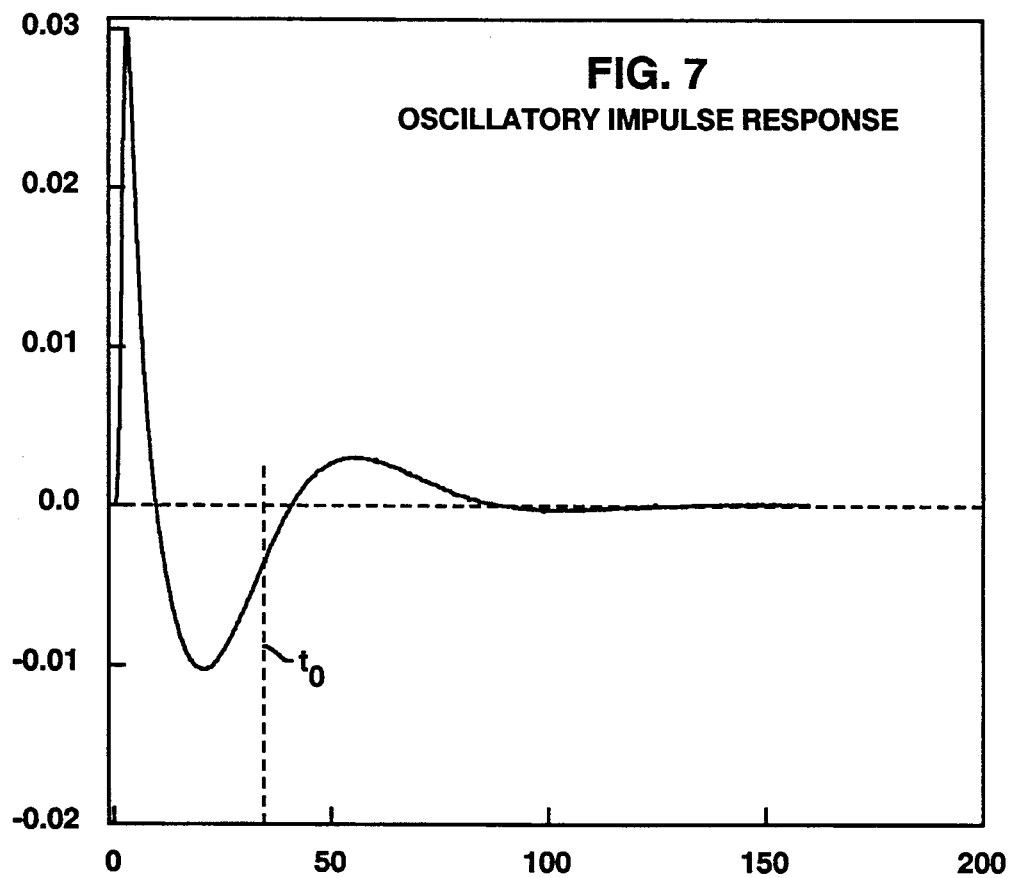
FIG. 7 shows a graph of the impulse response for a twisted-wire pair subscriber loop transmission line having a bridged tap which causes ringing on the transmission line.

It has been found that with 50 taps, a prior art conventional decision feedback equalizer is approximately 15 dB worse than the equalizer of FIG. 5 with one pole. For the impulse response of FIG. 6, the performance of a feedback filter with two poles is no better than with one pole. However, this is not the case for subscriber loop impulse responses that exhibit oscillatory behavior. FIG. 7 shows such an impulse response. If the FIR filter 83 has a sufficient number of taps to span the first two half cycles of the impulse response, up to time $t_0$ in FIG. 7, then the decaying sinusoid to the right of $t_0$ in the impulse response can be simulated with an IIR filter with two polse. The location of $t_0$ can, of course, be selected so as to minimize the overall number of taps and hence the overall complexity of the decision feedback equalizer.

It should be clear to those skilled in the art that further embodiments of the present invention may be made by those skilled in the art without departing from the teachings of the present invention.

What is claimed is:

1. An adaptive equalizer for pulse transmission systems comprising
    a precursor compensating circuit for compensating for intersymbol interference preceding the desired pulse signal, and
    a post-cursor compensating circuit in series with and following said precursor compensating circuit for compensating for intersymbol interference following said desired pulse signal,
    said post-cursor compensating circuit comprising a decision feedback equalizer including a first means for compensating for the part of the post-cursor intersymbol interference caused by the initial rapidly changing transient response to the pulse signal and a second means in parallel with said first means for compensating for the part of the post-cursor intersymbol interference caused by the slow changing tail segment impulse response to the pulse signal.

2. The adaptive equalizer according to claim 1 wherein said precursor compensating circuit comprises a linear transversal filter.

3. The adaptive equalizer according to claim 1 wherein said filter having a high range of adaptability comprises a linear transversal filter.

4. An adaptive equalizer for pulse transmission systems for compensating for intersymbol interference between received pulses, said equalizer comprising a precursor compensating circuit for compensating for intersymbol interference preceding the desired pulse signal, and a post-cursor compensating circuit in series with and following said precursor compensating circuit for compensating for intersymbol interference following said desired pulse signal, said post-cursor compensating circuit comprising a decision feedback equalizer including a filter section having a high range of adaptability and a filter section having a substantially lower range of adaptability comprised of a pole-zero transversal filter having tap coefficients.

5. The adaptive equalizer according to claim 3 wherein said linear transversal filter comprises a finite impulse response filter.

6. The adaptive equalizer according to claim 4 wherein said pole-zero transversal filter comprises a multiplier connected in series with a subtracter the output of which is applied throught a circuit having a transfer function given by $(1-B(z))$ to the other input of said subtracter.

7. The adaptive equalizer according to claim 6 further comprising an adapting circuit to control said decision feedback equalizer utilizing an equation error algorithm.

8. The adaptive equalizer according to claim 7 wherein said adapting circuit comprises a second finite impulse response filter having the same tap coefficients as said pole-zero transversal filter.

9. An adaptive equalizer comprising a decision feedback circuit including a first feedback path and a second feedback path, said first feedback path, said first feedback path containing a means for compensating for the part of the post-cursor intersymbol interference caused by the initial rapidly changing transient response to the pulse signal, and said second feedback path containing a means for compensating for the part of the post-cursor interference caused by the slow changing tail segment impulse response to the pulse signal.

10. The adaptive equalizer according to claim 9 further comprising an equation error adapting circuit for adjusting the tap coefficients on said filters.

11. The adaptive equalizer according to claim 9 wherein said finite impulse response filter comprises a tapped linear transversal filter of order n, where n is the number of pulse periods between the preferred sampling time in the impulse response of the connected transmission and the beginning of the asymptotic tail of said impulse response.

12. An adaptive equalizer comprising a decision feedback circuit including a first feedback path and a second feedback path, a first feedback path containing a finite impulse response filter, and said second feedback path containing an infinite impulse response filter comprised of a pole-zero transversal filter with no more than three poles.

13. A digital receiver for twisted-pair subscriber loop transmission systems comprising a pre-cursor equalizing circuit, a pair of signal subtractors, and a threshold detector connected in series, a first feedback path from the output of said threshold detector to a first one of said subtractors containing a finite impulse response transversal filter means for compensating for the part of the post-cursor intersymbol interference caused by the initial rapidly changing transient response to the pulse signal, and a second feedback path from the output of said threshold detector to a first one of said subtractors containing an infinite impulse response transversal filter means for compensating for the part of the post-cursor interference caused by the slow changing tail segment impulse response to the pulse signal.

14. The digital receiver according to claim 13 further comprising an equation error determining circuit for generating an error signal for adjusting the taps on said transversal filters.

15. The digital receiver according to claim 13 wherein said finite impulse response transversal filter comprises a tapped linear all-zeroes transversal filter having a number of taps approximately equal to the number of pulse periods between the time of the maximum value of the impulse response for said transmission system and the group delay time of said transmission system.

16. A digital receiver for twisted-pair subscriber loop transmission systems comprising a pre-cursor equalizing circuit, a pair of signal subtractors, and a threshold detector connected in series, a first feedback path from the output of said threshold detector to a first one of said subtractors containing a finite impulse response transversal filter, and a second feedback path from the output of said threshold detector to a second one of said subtractors, said second feedback path comprising an infinite impulse response transversal filter which comprises a tapped pole-zero transversal filter having no more than four taps.

* * * * *

UNITED STATES PATENT AND TRADEMARK OFFICE
CERTIFICATE OF CORRECTION

PATENT NO. : 5,031,194

DATED : July 9, 1991

INVENTOR(S) : P. M. Crespo and M. L. Honig

It is certified that error appears in the above-identified patent and that said Letters Patent is hereby corrected as shown below:

In claim 3, column 12, line 67, the phrase "filter having a high range of adaptability" should be deleted and replaced with --first means--.

In claim 13, column 14, line 24, the word "first" should be deleted and replaced with --second--.

Signed and Sealed this

Twenty-third Day of February, 1993

Attest:

STEPHEN G. KUNIN

*Attesting Officer*     Acting Commissioner of Patents and Trademarks